United States Patent [19]
Nielsen

[11] Patent Number: 5,036,493
[45] Date of Patent: Jul. 30, 1991

[54] SYSTEM AND METHOD FOR REDUCING POWER USAGE BY MULTIPLE MEMORY MODULES

[75] Inventor: Michael J. K. Nielsen, Palo Alto, Calif.

[73] Assignee: Digital Equipment Corporation, Maynard, Mass.

[21] Appl. No.: 494,672

[22] Filed: Mar. 15, 1990

[51] Int. Cl.⁵ .............................................. G11C 7/00
[52] U.S. Cl. ........................... 365/230.03; 365/230.06; 365/233
[58] Field of Search ...................... 365/230.03, 230.06, 365/230.08, 233

[56] References Cited

U.S. PATENT DOCUMENTS

| | | | |
|---|---|---|---|
| 3,703,710 | 11/1972 | Kubo et al. | 365/226 |
| 3,803,554 | 4/1974 | Bock et al. | 340/825.07 |
| 4,151,611 | 4/1979 | Sugawara et al. | 365/227 |
| 4,387,449 | 6/1983 | Masuda | 365/227 |
| 4,447,895 | 5/1984 | Asano et al. | 365/226 |
| 4,561,070 | 12/1985 | Armstrong | 365/227 |
| 4,636,982 | 1/1987 | Takemae et al. | 365/230.03 |
| 4,670,859 | 6/1987 | Furihata et al. | 365/104 |
| 4,686,651 | 8/1987 | Armstrong et al. | 365/226 |
| 4,809,234 | 2/1989 | Kuwashiro | 365/230.03 |
| 4,905,201 | 2/1990 | Ohira et al. | 365/230.03 |

Primary Examiner—Joseph A. Popek
Attorney, Agent, or Firm—Flehr, Hohbach, Test, Albritton & Herbert

[57] ABSTRACT

A computer memory system has multiple memory banks, only one of which can be accessed at any one instant in time. A memory bank decoder determines which of the memory banks is being accessed. The decoded bank enable signals generated by the decoder are used to send memory clocking signals only to the memory bank which is being accessed. In addition, each memory bank includes a clocked address signal buffer and a clocked data signal buffer. Clock signals are sent only to the address and data buffers in the memory bank which is being accessed. As a result, only the selected memory bank has its address and data buffers updated. All the other memory banks remain in a quiescent state, because no control signal, address signals, or data signals are sent to those memory banks. This eliminates the energy usage that would otherwise be associated with the idle memory banks, including both the energy used by the memory chips in the idle memory banks, as well as the energy associated with changing the state of the address and data lines connected to those memory chips.

8 Claims, 2 Drawing Sheets

SYSTEM AND METHOD FOR REDUCING POWER USAGE BY MULTIPLE MEMORY MODULES

The present invention relates generally to computer systems having two or more memory banks or modules and particularly to methods and systems for reducing the amount of power consumed by such memory modules.

BACKGROUND OF THE INVENTION

The present invention concerns hardware for reducing the amount of power consumed by the high speed random access memory (RAM) used in a computer system. Many computers are designed so that it is relatively easy to increase the amount of RAM which is installed in the computer. Typically, at least in "workstation" computers, it is common to provide a set of memory slots, into each of which can be inserted an additional memory module. As additional memory modules are added to the computer, however, the amount of power consumed by these memory modules can be quite significant. The result is an increase in the power, heat and cooling fan noise of the system. For an office environment, this increased heat and noise is very undesirable.

More generally, for high performance workstations, a high capacity memory system is desirable. Powerful computer systems tend to have multiple banks of memory to provide a large total capacity of memory to execute large programs, or multi-task between several smaller programs. However, the computer's central processor can only access one of the banks of memory at a given instant in time.

In prior art multiple bank memory systems, it is quite typical to only activate the memory chips for the active bank. However, the idle memory banks still receive address, data and clock signals, which are used only by the active memory bank. In a large memory system, the energy associated with switching these signals to the idle banks of memory chips consumes a significant amount of power.

The present invention implements a clocking scheme on the memory modules such that only the active memory module is clocked. In other words, only the active memory module receives data, address and clock signals. This eliminates all of the electrical switching on the idle memory modules, except for dynamic refresh cycles. As a result there is a dramatic decrease in system power and cooling requirements.

SUMMARY OF THE INVENTION

In summary, the present invention is a memory system for a computer. The memory system has multiple memory banks, only one of which can be accessed at any one instant in time. A memory bank decoder determines which of the memory banks is being accessed. The decoded bank enable signals generated by the decoder are used to send memory clocking signals only to the memory bank which is being accessed. In addition, each memory bank includes a clocked address signal buffer and a clocked data signal buffer. Clock signals are sent only to the address and data buffers in the memory bank which is being accessed. As a result, only the selected memory bank has its address and data buffers updated.

All the other memory banks remain in a quiescent state, because no control signal, address signals, or data signals are sent to those memory banks. This eliminates the energy usage that would otherwise be associated with the idle memory banks, including both the energy used by the memory chips in the idle memory banks, as well as the energy associated with changing the state of the address and data lines connected to those memory chips.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
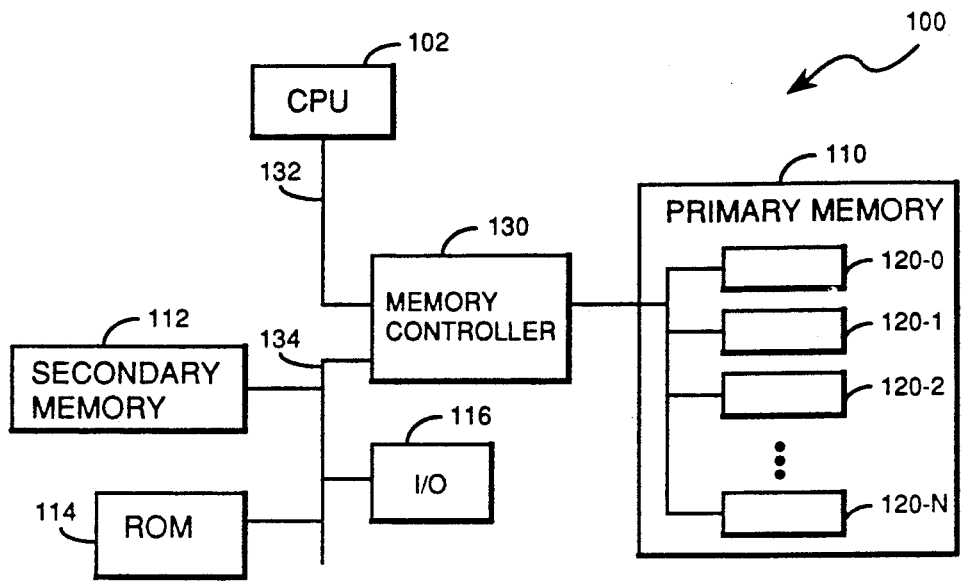
FIG. 1 is a block diagram of a computer system with multiple memory blocks.

Referring to FIG. 1, there is shown a computer system 100. The system 100 includes a central processing unit (CPU) 102, primary memory 110, secondary memory 112, read only memory (ROM) 114 and an input/output module 116. The primary memory 110 contains one or more modules 120-0 to 120-N of high speed random access memory (RAM). Access to the primary memory 110 is governed by a memory controller 130, which is coupled to the CPU 102 by system bus 132, which includes an address bus, data bus and control bus (not shown). The secondary memory 112 typically contains one or more magnetic or optical disk drives and is used for storing software and data not currently being used or stored in primary memory 110.

The terms memory module, memory block and memory array are used interchangeably. These terms generally refer to a separately identifiable portion of a computer's memory, e.g., a set of memory chips which occupy a contiguous portion of a computer's address space.

For the purposes of this document, when the name of a signal is preceding by a "~" symbol, the signal is negative logic signal which is active when low.

The secondary memory 112 typically contains one or more magnetic or optical disk drives and is used for storing software and data not currently being used or stored in primary memory 110. Read only memory 114 is used to store portions of the computer's operating system (e.g., self test software and boot strap software). The CPU 102 is coupled to secondary memory 112, ROM 114 and I/O 116 by the memory controller 130 and the I/O bus 134. Secondary memory 112, read only memory 114 and I/O module 116 are herein collectively referred to as the computer's I/O subsystem.

Figure 2:
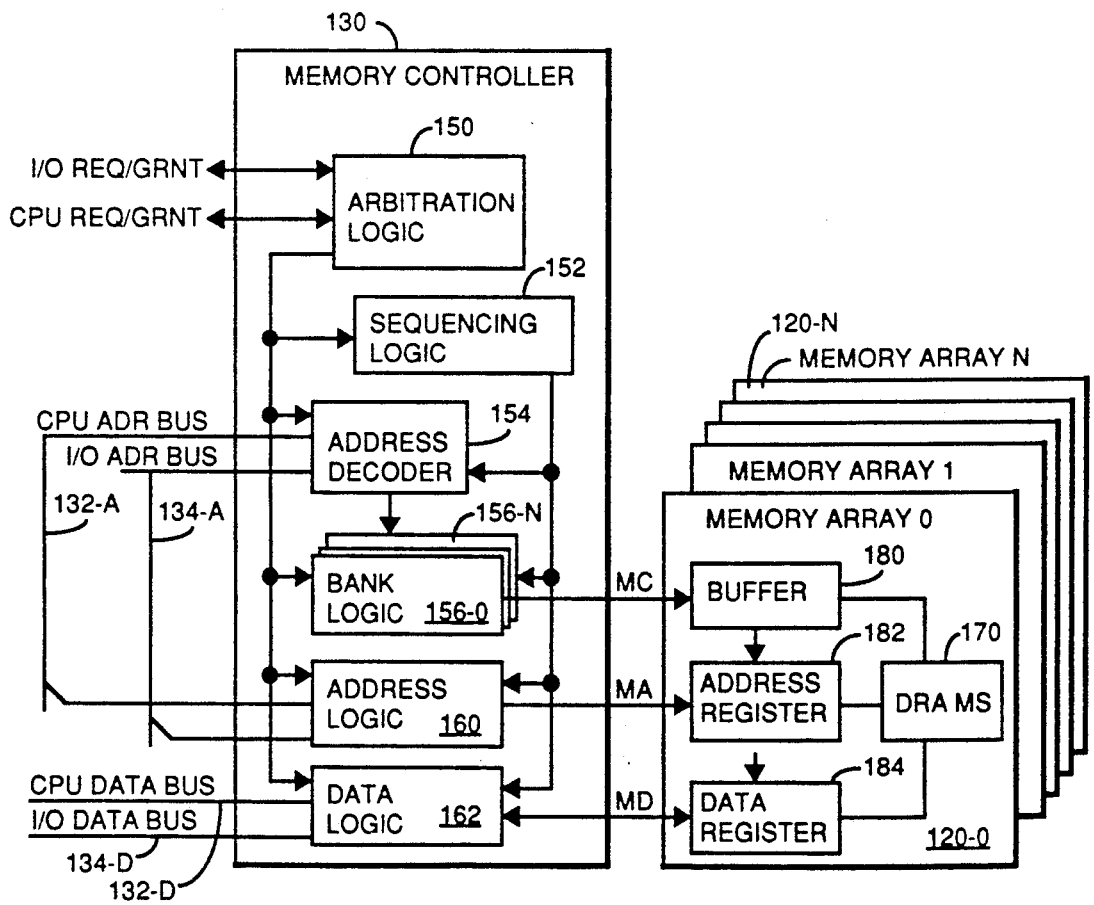
FIG. 2 is a block diagram of a multiple bank memory system.

Referring to FIG. 2, the memory controller 130 is a conventional memory controller, except that it generates a separate set of clock and control signals MC for each memory block 120. Arbitration logic 150 resolves conflicting memory access requests originating from the CPU 102 (CPU REQ/GRNT) and from the I/O subsystem (I/O REQ/GRNT). Output signals from the arbitration logic are used by all the other modules in the memory controller 130 to initiate a memory access cycle and to determine whether to use address and data signals from the CPU 102 or the I/O subsystem.

Sequencing logic 152 generates the standard clock signals needed for controlling access to dynamic memory chips, including ~WE (write enable, or read/write), ~RAS (row address strobe), and ~CAS (column address strobe). The sequencing logic also generates clock and control signals for use by address decoder 154, bank logic 156, address logic 160 and data logic 162.

Address decoder 154 decodes the high order address bits from either the CPU's system address bus 132-A or the I/O address bus 134-A to determine which memory bank 120 is being accessed, if any. The address decoder 154 generates a separate one-bit bank-enable signal for each memory bank 120.

In the preferred embodiment, the system 100 has fourteen memory module slots, each of which can receive a memory module 120. Each memory module slot is assigned a predefined address range in the computer's address space, and the address decoder 154 generates a bank enable signal for each slot, regardless of whether there is a memory module inserted in the slot or not. Software in the computer ensures that memory modules not present are not accessed. The fourteen bank enable signals generated by the address decoder, ~BANK_0_ENABLE through ~BANK_13_ENABLE, are transmitted to a set of fourteen bank logic circuits 156-0 to 156-13.

Figure 4:
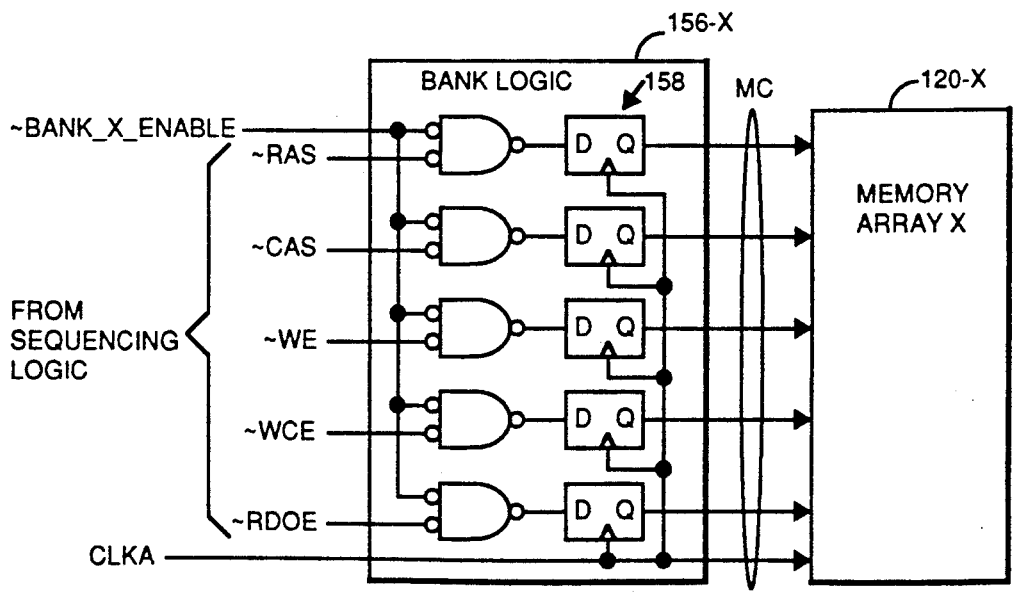
FIG. 4 depicts the bank logic for one memory bank.

Each bank logic circuit 156-X is coupled to the sequencing logic 152, the address decoder 154, and a corresponding one of the memory modules 120-X. As shown in more detail in FIG. 4, each bank logic circuit 156-X logically ANDs the corresponding memory bank enable signal ~BANK_X_ENABLE with the clocking signals generated by the sequencing logic 152.

These ANDed signals are stored in pipeline flip-flops 158 which are clocked by a free running clock CLKA, and then transmitted to a corresponding memory module 120-X. The pipelined sequencing signals are collectively labelled MC in FIGS. 2 and 4. Since ~BANK_X_ENABLE is ON for only one memory slot and OFF for thirteen of the fourteen memory slots, sequencing signals are transmitted to only one of the memory modules 120. When a location in the computer's I/O subsystem is being accessed, or when no memory location is be accessed, sequencing signals are not sent to any of the memory modules 120.

Referring again to FIG. 2, address logic circuit 160 presents address signals MA generated by either the CPU 102 or the I/O subsystem to the memory modules in the format and timing required by the memory chips in the modules. In particular, the memory modules 120 use dynamic memory chips, which require that the address signals be time multiplexed so that one half of the address bits are presented to the memory module first with a clock signal called ~RAS and the other half of the address bits are presented next with a clock signal called ~CAS. The details of memory control circuits for dynamic memory chips are well known to those skilled in the art.

The data logic circuit 162 transmits data signals MD between the memory array modules and the CPU 102 or the I/O subsystem in the format and timing required by the memory chips in the modules.

Figure 3:
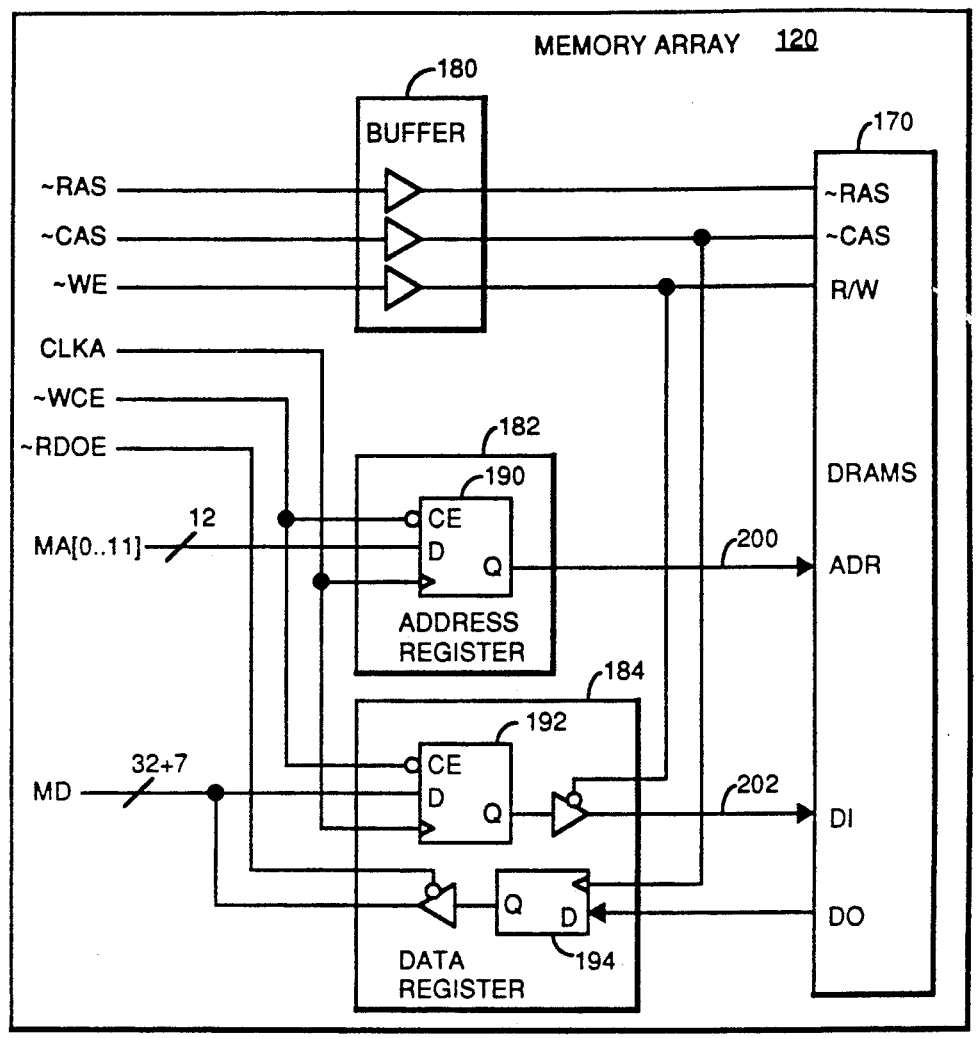
FIG. 3 depicts the control signal, address and data buffers in one memory bank.

Referring to FIGS. 2 and 3, each memory array module contains an array of dynamic random access memory (DRAM) chips 170. In the preferred embodiment, each DRAM array contains thirty-two one megabit DRAM chips for storing data and seven additional one-megabit DRAM chips for storing error correction codes. Thus there are a total of thirty-nine DRAM chips in the array 170.

A control signal buffer 180 drives the ~RAS, ~CAS and ~WE signals to the DRAM array 170. The address register 182 is a set of clocked flip-flops which capture memory addresses and drive the address signals to the DRAM array 170. The data register 184 is a bidirectional latch which buffers the transmission of data between the memory controller 130 and the DRAM array 170.

As shown in FIG. 3, the positive edge of a clock signal labelled CLKA is used to latch the address bits into a set of address latches 190. CLKA is a free running clock which is also used to write data from the memory controller into a set of data write pipeline registers 192. Signal ~WCE is a clock enable signal for both the address latches 190 and the date write pipeline registers 192. This signal ~WCE must be low to enable latching of address and write data at the rising edge of the CLKA clock signal.

Data from the data write pipeline register 192 is transmitted to the DRAMS only if ~WE is low, which means that a write cycle is being performed. Data read from the DRAMs is latched in pipeline registers 194 by the rising edge of the ~CAS signal, and is transferred to the memory controller only when the read output enable signal ~RDOE is low. In the preferred embodiment, data is transferred to and from the DRAMs 32 bits at a time. In addition a 7 bit error correction code is stored and retrieved for each 32 bits of data.

When a memory module 120 is not selected for access, the signals stored in the memory module's address register 182 and data register 184 remain unchanged. In the preferred embodiment, the address register 182 and the data register 184 are implemented using CMOS circuitry. Furthermore, the signal buffer 180 in the memory modules are also implemented using CMOS circuitry. This reduces power consumption further because in CMOS circuitry non-switching wires and devices only experience leakage currents.

In the preferred embodiment, bank logic circuit 156 is implemented using a bipolar programmable logic array, but an equivalent CMOS circuit would be used if fast enough CMOS logic parts become available. Buffer 180 is implemented using a 74FCT244 circuit, register 182 using a 74FCT377 and register 184 using a 29FCT52, all made by Integrated Device Technologies (IDT).

When a memory module 120 is not selected, almost no power is dissipated inside the memory module, because (1) no clock and control signals are sent by the bank logic 156 to the memory module 120, and (2) the CMOS address and data registers 182 and 184 in the memory module do not perform any switching and the signals on address lines 200 and data lines 202 in the memory module remain unchanged.

Transmitting or switching address and data signals to thirty-nine one-megabit DRAM chips consumes a significant amount of current and power. In the preferred embodiment, an inactive (i.e., unselected) memory module containing thirty-nine one-megabit DRAM chips consumes only about 0.043 amperes of current.

In summary, it can be seen from the above description that the clock signals generated by the memory controller 130 are transmitted to only one memory module, and that the address signals and data signals generated by the memory controller 130 are switched only in the selected memory controller. The present invention allows computer systems to have a larger memory system for a given power and cooling system than would otherwise be possible. Since the size of the memory system directly affects the scale and performance of computer applications, the present invention indirectly helps boost the amount of computer power than can be manufactured or purchased for a given price.

ALTERNATE EMBODIMENTS

As will be understood by those skilled in the art, the location of the buffer and register circuitry which are included in the memory modules of the preferred embodiment could be located in the memory controller in other embodiments of the present invention. The "location" of these circuits on the same circuit board as the DRAM chips is not essential to the present invention. What is important is avoiding the switching and transmission of signals to unselected memory modules.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A computer memory system, comprising:
   address bus means for transmitting sets of address signals, each set of address signals defining an address in a predefined address space;
   data bus means for transmitting sets of data signals;
   a plurality of memory module means, coupled to said address bus means and data bus means, each memory module means storing data in a corresponding assigned range of address locations in said predefined address space; wherein each said memory module means comprises one or more memory storage devices distinct from the memory storage devices in other ones of said plurality of memory module means;
   decoder means, coupled to said address bus means and said plurality of memory module means, for decoding said sets of address signals and generating a memory module enable signal corresponding to one of said memory module means whenever said set of address signals define an address in one of said address ranges assigned to said plurality of memory module means;
   sequencing means for generating memory control signals for accessing data stored in said plurality of memory module means; and
   a plurality of logic and register means, each logic and register means coupled to said address bus means, data bus means, decoder means, sequencing means and a corresponding one of said memory module means, for transmitting said memory control signals from said sequencing means, address signals from said address bus means and data signals from said data bus means to said corresponding memory module means only when said decoder means generates a memory module enable signal for said corresponding memory module means; wherein said register means comprises CMOS circuits which dissipate only leakage current when not enabled by a memory module enable signal;
   whereby control, address and data signals are not transmitted to any of said plurality of memory module means for which a memory module enable signal has not been generated.

2. A computer memory system, comprising:
   address bus means for transmitting sets of address signals, each set of address signals defining an address in a predefined address space;
   data bus means for transmitting sets of data signals;
   a plurality of memory module means, coupled to said address bus means and data bus means, each memory module means storing data in a corresponding assigned range of address locations in said predefined address space;
   decoder means, coupled to said address bus means and said plurality of memory module means, for decoding said sets of address signals and generating a memory module enable signal corresponding to one of said memory module means whenever said set of address signals define an address in one of said address ranges assigned to said plurality of memory module means;
   sequencing means for generating memory control signals for accessing data stored in said plurality of memory module means; and
   a plurality of logic and register means, each logic and register means coupled to said address bus means, data bus means, decoder means, sequencing means and a corresponding one of said memory module means, for transmitting said memory control signals from said sequencing means, address signals from said address bus means and data signals from said data bus means to said corresponding memory module means only when said decoder means generates a memory module enable signal for said corresponding memory module means;
   said sequencing means including means for generating a clock signal;
   said decoder means including means for generating a plurality of memory module enable signals, including a separate memory module enable signal for each said memory module means, at most one of which is enabled at any one time;
   each said logic and register means including:
     clock buffer means for logically ANDing said clock signal with a corresponding memory module enable signal so as to generate a gated clock signal for said corresponding memory module means; and
     clocked register means, coupled to said clock buffer means, for storing address signals and data signals being transmitted between said address and data bus means and said corresponding memory module means, said clocked register means including means for updating address and data signals stored therein only when said gated clock signal for said corresponding memory module means is generated by said clock buffer means;
   whereby control, address and data signals are not transmitted to a memory module means for which a memory module enable signal has not been generated.

3. A computer memory system, comprising:
   address bus means for transmitting sets of address signals, each set of address signals defining an address in a predefined address space;
   data bus means for transmitting sets of data signals;
   a plurality of memory module means, coupled to said address bus means and data bus means, each memory module means storing data in a corresponding assigned range of address locations in said predefined address space;

decoder means, coupled to said address bus means and said plurality of memory module means, for decoding said sets of address signals and generating a memory module enable signal corresponding to one of said memory module means whenever said set of address signals define an address in one of said address ranges assigned to said plurality of memory module means;

sequencing means for generating memory control signals for accessing data stored in said plurality of memory module means; and a plurality of logic and register means, each logic and register means coupled to said address bus means, data bus means, decoder means, sequencing means and a corresponding one of said memory module means, for transmitting said memory control signals from said sequencing means, address signals from said address bus means and data signals from said data bus means to said corresponding memory module means only when said decoder means generates a memory module enable signal for said corresponding memory module means;

said sequencing means including means for generating first and second clock signals;

said decoder means including means for generating a plurality of memory module enable signals, including a separate memory module enable signal for each said memory module means, at most one of which is enabled at any one time;

each said logic and register means including:
  clock buffer means for logically ANDing said first and second clock signals with a corresponding memory module enable signal so as to generate first and second gated clock signals for said corresponding memory module means;
  clocked address register means, coupled to said clock buffer means, for storing address signals being transmitted from said address bus means to said corresponding memory module means, said clocked address register means including means for updating address signals stored therein only when said first gated clock signal for said corresponding memory module means is generated by said clock buffer means; and
  clocked data register means, coupled to said clock buffer means, for storing data signals being transmitted between said address bus means and said corresponding memory module means, said clocked data register means including means for updating data signals stored therein and being transmitted from said data bus to said memory module means when said first gated clock signal for said corresponding memory module means is generated by said clock buffer means, and means for updating data signals stored therein and being transmitted from said memory module means to said data bus when said second gated clock signal for said corresponding memory module means is generated by said clock buffer means;

whereby control, address and data signals are not transmitted to any of said plurality of memory module means for which a memory module enable signal has not been generated.

4. A computer memory system, comprising:

address bus means for transmitting sets of address signals, each set of address signals defining an address in a predefined address space;

data bus means for transmitting sets of data signals;

a plurality of memory module means, coupled to said address bus means and said data bus means, each memory module means storing data in a corresponding assigned range of address locations in said predefined address space;

decoder means coupled to said address bus means and said plurality of memory module means, for decoding each said set of address signals, and for generating a memory module enable signal corresponding to one of said memory module means whenever said set of address signals define an address in one of said address ranges assigned to said plurality of memory module means;

sequencing means for generating memory control signals for accessing data stored in said plurality of memory module means;

bank logic means for each said memory module means, each bank logic means coupled to said decoder means, said sequencing means and a corresponding one of said memory module means, for buffering said memory control signals and transmitting said memory control signals to said corresponding memory module means only when said decoder means generates a memory module enable signal for said corresponding memory module means;

a plurality of address register means, each address register means coupled to said address bus means, said decoder means and a corresponding one of said memory module means, each said address register means including means for transmitting address signals from said address bus means to a corresponding memory module means only when said decoder means generates a memory module enable signal for said corresponding memory module means; and a plurality of data register means, each data register means coupled to said address bus means, said decoder means and a corresponding one of said memory module means, each said data register means including means for transmitting data signals between said address bus means and a corresponding memory module means only when said decoder means generates a memory module enable signal for said corresponding memory module means.

5. A computer memory system as set forth in claim 4, wherein said address register and data register means comprises CMOS circuits which dissipate only leakage current when not enabled by a memory module enable signal.

6. A computer memory system as set forth in claim 4, said sequencing means including means for generating first and second clock signals;

said decoder means including means for generating a plurality of memory module enable signals, including a separate memory module enable signal for each said memory module means, at most one of which is enabled at any one time;

each said bank logic means including clock buffer means for logically ANDing said first and second clock signals with a corresponding memory module enable signal so as to generate first and second gated clock signals for said corresponding memory module means;

each said address register means comprising clocked address register means coupled to said clock buffer means for storing address signals being transmitted from said address bus means to said corresponding memory module means, said clocked address register means including means for updating address signals stored therein only when said first gated clock signal for said corresponding memory module means is generated by said clock buffer means; and each said data register means comprising clocked data register means coupled to said clock buffer means for storing data signals being transmitted between said address bus means and said corresponding memory module means, said clocked data register means including means for updating data signals stored therein and being transmitted from said data bus to said memory module means when said first gated clock signal for said corresponding memory module means is generated by said clock buffer means, and means for updating data signals stored therein and being transmitted from said memory module means to said data bus when said second gated clock signal for said corresponding memory module means is generated by said clock buffer means.

7. A computer memory system, comprising:

an address bus for transmitting sets of address signals, each set of address signals defining an address in a predefined address space;

a data bus for transmitting sets of data signals;

a plurality of memory modules, coupled to said address bus and data bus, each memory module storing data in a corresponding assigned range of address locations in said predefined address space; wherein each said memory module means comprises one or more memory storage devices distinct from the memory storage devices in other ones of said plurality of memory module means;

decoder means, coupled to said address bus and said plurality of memory modules, for selecting one of said memory modules when said set of address signals define an address in one of said address ranges assigned to said plurality of memory modules;

sequencing means for generating memory control signals for accessing data stored in said plurality of memory modules; and logic and register means, coupled to said address bus means, data bus means, decoder means, sequencing means and said plurality of memory module means, for transmitting said memory control signals, address signals and data signals only to said selected memory module means; wherein said register means comprises CMOS circuits which store updated address and data signals and which dissipate only leakage current when not enabled by a memory module enable signal;

whereby control, address and data signals are not transmitted to any of said plurality of memory module means which do not correspond to said set of address signals on said address bus.

8. A computer memory system, comprising:

an address bus for transmitting sets of address signals, each set of address signals defining an address in a predefined address space;

a data bus for transmitting sets of data signals;

a plurality of memory modules, coupled to said address bus and data bus, each memory module storing data in a corresponding assigned range of address locations in said predefined address space;

decoder means, coupled to said address bus and said plurality of memory modules, for selecting one of said memory modules when said set of address signals define an address in one of said address ranges assigned to said plurality of memory modules;

sequencing means for generating memory control signals for accessing data stored in said plurality of memory modules; and logic and register means, coupled to said address bus means, data bus means, decoder means, sequencing means and said plurality of memory module means, for transmitting said memory control signals, address signals and data signals only to said selected memory module means;

said sequencing means including means for generating a clock signal;

said decoder means including means for generating a plurality of memory module enable signals, including a separate memory module enable signal for each said memory module means, at most one of which is enabled at any one time;

each said logic and register means including:
clock buffer means for logically ANDing said clock signal with a corresponding memory module enable signal so as to generate a gated clock signal for said corresponding memory module means; and clocked register means, coupled to said clock buffer means, for storing address signals and data signals being transmitted between said address and data bus means and said corresponding memory module means, said clocked register means including means for updating address and data signals stored therein only when said gated clock signal for said corresponding memory module means is generated by said clock buffer means;

whereby control, address and data signals are not transmitted to any of said plurality of memory module means which do not correspond to said set of address signals on said address bus.

* * * * *